(12) United States Patent
Tsukada et al.

(10) Patent No.: US 7,470,983 B2
(45) Date of Patent: Dec. 30, 2008

(54) SEMICONDUCTOR DEVICE REDUCING WARPING DUE TO HEAT PRODUCTION

(75) Inventors: Yoshinari Tsukada, Sayama (JP); Kimio Hachisuka, Sayama (JP); Hiroshi Yarita, Sayama (JP); Fumitomo Takano, Sayama (JP); Yasuro Yamanaka, Sayama (JP)

(73) Assignee: Honda Motor Co., Ltd., Tokyo (JP)

( * ) Notice: Subject to any disclaimer, the term of this patent is extended or adjusted under 35 U.S.C. 154(b) by 337 days.

(21) Appl. No.: 10/559,923

(22) PCT Filed: Apr. 23, 2004

(86) PCT No.: PCT/JP2004/005929

§ 371 (c)(1),
(2), (4) Date: Dec. 8, 2005

(87) PCT Pub. No.: WO2004/112130

PCT Pub. Date: Dec. 23, 2004

(65) Prior Publication Data

US 2006/0145334 A1     Jul. 6, 2006

(30) Foreign Application Priority Data

Jun. 10, 2003 (JP) .............................. 2003-165477

(51) Int. Cl.
*H01L 23/34* (2006.01)
*H01L 23/36* (2006.01)
*H01L 23/12* (2006.01)
*H01L 23/15* (2006.01)
*H01L 23/373* (2006.01)

(52) U.S. Cl. ................. 257/717; 257/E23.11; 257/706; 257/707; 257/712; 257/675; 257/678

(58) Field of Classification Search ................. 257/717, 257/E23.11, 706, 707, 712, 675, 678, 720, 257/721

See application file for complete search history.

(56) References Cited

U.S. PATENT DOCUMENTS

| | | | |
|---|---|---|---|
| 4,497,875 A * | 2/1985 | Arakawa et al. | 428/620 |
| 6,911,728 B2 * | 6/2005 | Ishikawa et al. | 257/706 |
| 7,074,471 B2 * | 7/2006 | Kitaura et al. | 428/64.1 |
| 7,161,807 B2 * | 1/2007 | Ishikawa et al. | 361/708 |
| 2004/0183172 A1 * | 9/2004 | Saito et al. | 257/678 |
| 2004/0194861 A1 * | 10/2004 | Endou et al. | 148/432 |
| 2007/0183127 A1 * | 8/2007 | Ishikawa et al. | 361/709 |
| 2007/0284731 A1 * | 12/2007 | Atsumi et al. | 257/706 |

FOREIGN PATENT DOCUMENTS

| | | | |
|---|---|---|---|
| JP | 02-034577 | | 2/1990 |
| JP | 05-175378 | | 7/1993 |
| JP | 09-298260 | | 11/1997 |
| JP | 2002-043482 | * | 2/2002 |
| JP | 2002-222887 | | 8/2002 |
| JP | 2004-253736 | * | 9/2004 |

* cited by examiner

*Primary Examiner*—Alexander O Williams
(74) *Attorney, Agent, or Firm*—Rankin, Hill & Clark LLP

(57) ABSTRACT

A semiconductor device includes an intermediate layer provided between a semiconductor element and a heat sink. The intermediate layer moderates thermal stress resulting from a difference between thermal expansion of the semiconductor element and thermal expansion of the heat sink arising due to heat produced by the semiconductor element. This thermal stress moderation reduces warping of the semiconductor device as a whole.

14 Claims, 1 Drawing Sheet

SEMICONDUCTOR DEVICE REDUCING WARPING DUE TO HEAT PRODUCTION

TECHNICAL FIELD

This invention relates to a semiconductor device and, in particular, to a semiconductor device in which warping of a semiconductor element caused by heat production is suppressed.

BACKGROUND ART

In recent years, for purposes such as power conversion and power control, or high-power amplification/oscillation and the like, semiconductor elements called power devices have been widely used. These semiconductor devices or elements include bipolar transistors, IGBT (Insulated Gate Bipolar Transistors), power ICs, and MOSFETs and the like, and they all have the merit that their conversion or control efficiency is high and they are small.

However, in these semiconductor elements, because a large current flows, the amount of heat produced is large, there is a risk of destruction or changes in characteristics occurring due to heat produced by the elements themselves, and so it is necessary them to be cooled efficiently. To this end, various cooling structures have been proposed up to now, and as one example of these, a conventional semiconductor device having a cooling structure is shown in FIG. 2 hereof.

Referring to FIG. 2, a semiconductor device 100 is made by providing an insulating plate 103 and a metal plate 104 between a semiconductor element 101 and a heat sink 102. The semiconductor element 101 is a power device such as a power transistor, a power FET, or an IGBT, and is made of a silicon semiconductor or the like. When the semiconductor element 101 operates, due to joule heat, heat is produced and its temperature rises. When the temperature of the semiconductor element 101 rises, its on-resistance increases, and when feedback control or the like is being carried out, further voltage is applied in order to make current flow, current flows, and consequently the joule heat increases and the temperature rises further. Because of this, breakage of the semiconductor element 101 occurs. To prevent this, the semiconductor device 100 is provided with a heat sink 102.

The heat sink 102 is made of copper or aluminum or the like, which have good thermal conductivity, and radiates heat produced by the semiconductor element 101. Consequently, it can prevent increase of the temperature of the semiconductor element 101. Accordingly, it is shaped so as to have a large radiating area.

The insulating plate 103 electrically insulates the semiconductor element 101 and the heat sink 102 from each other. For this, a material which has good thermal conductivity but is electrically insulating, such as SiN, is used.

The metal plate 104 is for supporting the semiconductor element 101 and the insulating plate 103, and is also for conducting heat from the semi-conductor element 101 to the heat sink 102. For this, a copper plate or the like which has good thermal conductivity and is a firm material is used.

The heat sink 102 is for diffusing heat produced in the semiconductor element 101 and conducted to it through the insulating plate 103 and the metal plate 104; it has a structure that makes its area of contact with air large, and is made of copper, aluminum, or molybdenum or an alloy of these. The semi-conductor element 101, the insulating plate 103, the metal plate 104 and the heat sink 102 are bonded together with solder or brazing filler material or the like.

In the conventional semiconductor device described above, there was the shortcoming that because compared to the thermal expansion coefficient of the semiconductor element the thermal expansion coefficient of the copper or aluminum or other metal is large, the metal expanding along with the production of heat by the semiconductor element causes thermal stress to arise, the device itself bends, and detachment and/or cracking or the like occur. To solve this kind of shortcoming, technology whereby the bonding material between the insulating plate and the heat sink is contrived to bond firmly has been disclosed, for example in JP-A-2002-43482. A hard brazing filler material including an active element is used for this bonding material.

As described above, in the conventional semiconductor device shown in FIG. 2, there was the shortcoming that because there is a difference in thermal expansion coefficient between the metal and the other materials, warping occurs in the device when the semiconductor element produces heat, and as a result detachment and cracks and so on occur. Thus there have been the problems that it has not been possible to apply a high load to the semiconductor element, its full potential performance cannot be exploited, a forced cooling device such as a water-cooling device or a fan or the like has been necessary, and the equipment has become large.

When the technology disclosed in JP-A-2002-43482 is used, because the thermal conductivity of the bonding material itself is poor, the performance of the semiconductor device in dispersing heat by conducting it to the heat sink is lost, and because as a result the semiconductor element is not efficiently cooled, it has not been possible to exploit the full potential performance of the semiconductor element. Also, the bonding material is expensive and has been a cause of increased cost of the semiconductor device.

Accordingly, technology has been demanded for reducing warping of a semiconductor device occurring when a semiconductor element produces heat has been awaited.

DISCLOSURE OF THE INVENTION

The present invention provides a semiconductor device comprising a semiconductor element, a heat sink, and an intermediate layer provided between the semiconductor element and the heat sink to moderate thermal stress.

Because an intermediate layer for moderating thermal stress is provided between the semiconductor element and the heat sink, thermal stress resulting from a difference between thermal expansion of the semiconductor device and thermal expansion of the heat sink arising due to heat produced by the semiconductor device can be moderated by means of the intermediate layer, and it is possible to reduce warping of the semiconductor device.

In the invention, preferably, the intermediate layer for moderating thermal stress is made of a carbon-copper composite material. Therefore, thermal stress concentrates at the intermediate layer made of the carbon-copper composite material, which has a low Young's modulus, and warping of the semiconductor device caused by differences between thermal expansion of the semiconductor element and thermal expansions of the layers of a laminar plate and thermal expansion of the heat sink can be reduced.

Also, the invention provides a semiconductor device comprising a semiconductor element, a heat sink, a laminar plate provided so as to include an intermediate layer for moderating thermal stress between the semiconductor element and the heat sink.

Because the laminar plate includes an intermediate layer for moderating thermal stress like this, thermal stress resulting from differences between thermal expansion of the semiconductor element and thermal expansions of the layers of the laminar plate and thermal expansion of the heat sink arising due to heat produced by the semiconductor element can be moderated, and it is possible to reduce warping of the semiconductor device.

The laminar plate, preferably, comprises a first metal plate bonded to the semiconductor element, the intermediate layer for moderating thermal stress bonded to the opposite side of the first metal plate from the semi-conductor element, a second metal plate bonded to the opposite side of the intermediate layer from the side thereof bonded to the first metal plate, an insulating member bonded to the opposite side of the second metal plate from the side thereof bonded to the intermediate layer, and a third metal plate bonded to the opposite side of the insulating member from the side thereof bonded to the second metal plate. Consequently, thermal stress resulting from differences between thermal expansion of the semiconductor element and thermal expansion of the layers of the laminar plate and thermal expansion of the heat sink arising due to heat produced by the semiconductor element can be moderated with the intermediate layer, and warping of the semiconductor device can be reduced. Because metal plates are included in the laminar plate its thermal conductivity is good and heat arising from the semiconductor element can be conducted to the heat sink well and can be radiated well.

Preferably, the thickness of the second metal plate and the thickness of the third metal plate are equal. When the thickness of the second metal plate and the thickness of the third metal plate are made equal like this, the thermal shock resistance can be made good and detachment of the layers of the laminar plate can be eliminated.

BEST MODE FOR CARRYING OUT THE INVENTION

Figure 1:
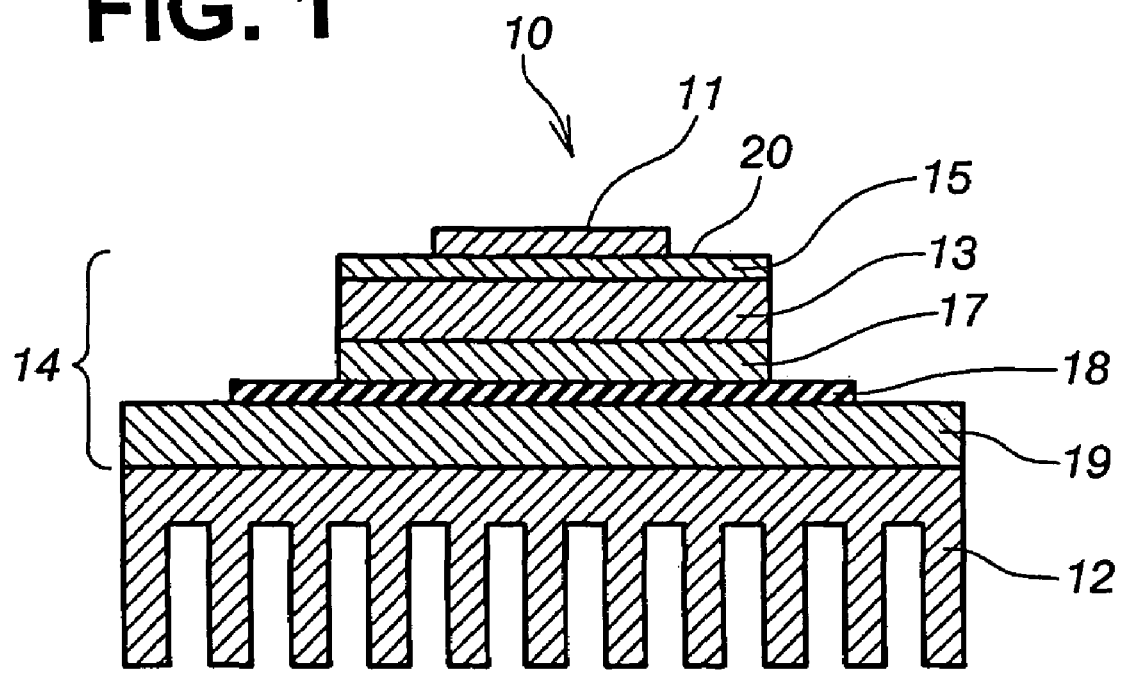
FIG. 1 is a sectional view of a semiconductor device according to an embodiment of the present invention.
Figure 2:
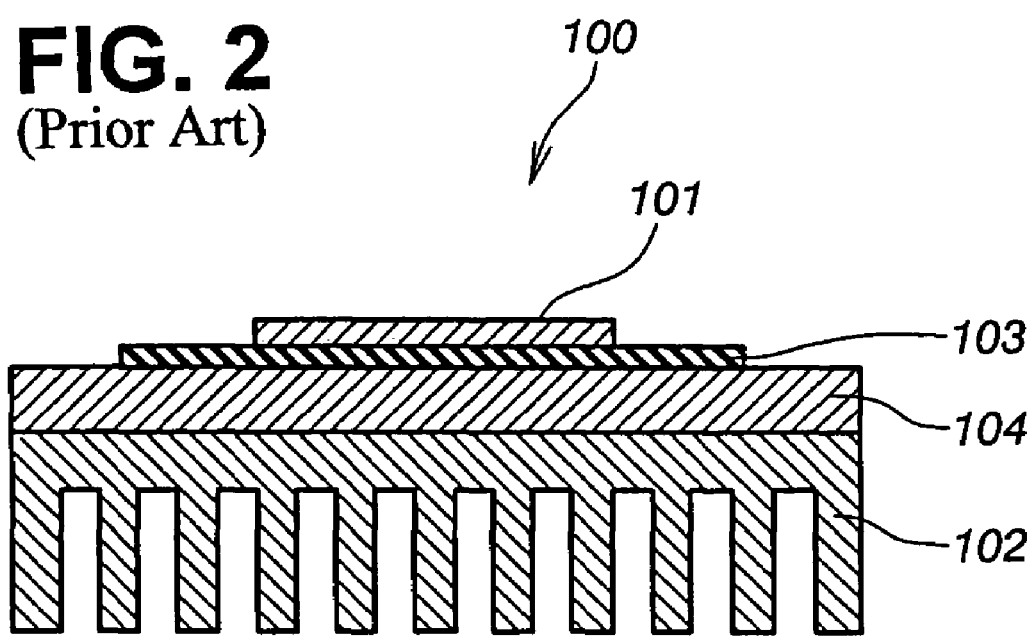
FIG. 2 is a sectional view of a conventional semiconductor device.

A semiconductor device 10 of this embodiment shown in FIG. 1 is made by providing an intermediate layer 13 for moderating thermal stress between a semiconductor element 11 and a heat sink 12. Preferably, it is made by providing a laminar plate 14 including an intermediate layer for moderating thermal stress between the semiconductor element 11 and the heat sink 12.

The semiconductor element 11 is a power device such as a power transistor, a power FET, or an IGBT, and is made of a silicon semiconductor or the like. When the semiconductor element 11 operates, joule heat causes heat to arise and its temperature rises. When the temperature of the semiconductor element 11 rises its on-resistance increases, and when feedback control or the like is being carried out, when further voltage is applied in order to make current flow, joule heat increases, and the temperature rises further. Because of this, breakage of the semiconductor element 11 occurs. To prevent this, the semiconductor device 10 is provided with a heat sink 12.

The heat sink 12 is made of copper or aluminum or molybdenum, which have good thermal conductivity, or an alloy of those or the like, and radiates heat produced from the semiconductor element 11. By this means it is possible to prevent rising of the temperature of the semiconductor element 11. Accordingly, it is shaped so as to have a large radiating area.

The laminar plate 14 is for conducting heat produced in the semi-conductor element 11 to the heat sink to radiate it.

This laminar plate 14 comprises a first metal plate 15 bonded to the semiconductor element 11 by means of a bonding material such as solder or brazing filler material, an intermediate layer 13 for moderating thermal stress bonded to the opposite side of that first metal plate 15 from the semiconductor element 11 with a bonding material such as solder or brazing filler material, a second metal plate 17 bonded to the opposite side of that intermediate layer 13 from the side thereof bonded to the first metal plate 15 with a bonding material such as solder or brazing filler material, an insulating member 18 bonded to the opposite side of that second metal plate 17 from the side thereof bonded to the intermediate layer 13 with a bonding material such as solder or brazing filler material, and a third metal plate 19 bonded to the opposite side of that insulating member 18 to the side thereof bonded to the second metal plate 17 with a bonding material such as solder or brazing filler material.

Ni plating 20 has been carried out on the surface of the face of the first metal plate 15 on the side thereof to which the semiconductor element 11 is bonded. The Ni plating 20 is for securing solderability and wire-bondability of the semiconductor element. The first metal plate 15 is for securing solderability and wire-bondability of the semiconductor element 11, and for dispersing heat in the plane direction. For this, a copper plate that is relatively thin but has high thermal conductivity is used.

The intermediate layer 13 is for moderating thermal stress resulting from differences between thermal expansion of the semiconductor element 11, thermal expansions of the layers of the laminar plate 14, and thermal expansion of the heat sink 12 arising due to heat produced in the semiconductor element 11. For this, a material having a small elastic constant in the laminate plane direction is used, and for example a carbon-copper composite material is used.

The second metal plate 17 is for temporarily storing heat produced in the semiconductor element 11 and conducted through the first metal plate 15 and the intermediate layer 13, and conducting heat via the insulating member 18 bonded to its lower side and the third metal plate 19 to the heat sink 12. For this, a copper plate that is relatively thick and has high thermal conductivity is used.

The insulating member 18 is for providing electrical insulation between the semiconductor element 11 and the heat sink 12. For this, a material having good thermal conductivity which is electrically insulating, such as SiN, is used.

The third metal plate 19 is for supporting the laminar structure above it, and is also for conducting heat from the semiconductor element 11 to the heat sink 12. For this, a copper plate or the like, which has good thermal conductivity and is firm, is used. It is desirable for any difference between the thickness of the third metal plate and the thickness of the second metal plate to be eliminated.

The heat sink 12 is for diffusing heat produced in the semiconductor element 11 and conducted to it by the laminar structure above it, and has a structure that makes its area of contact with air large, and is made of copper, aluminum, or molybdenum or an alloy of these.

These plates may alternatively be bonded by being made to sandwich Ti-Cu foil sprinkled with Mg powder and pressurized in an $N_2$ atmosphere and then annealed.

Next, the action of a semiconductor device 10 according to the present embodiment will be explained.

Heat produced while the semiconductor element 11 of the semiconductor device 10 is operating is conducted to the first metal plate 15, and because the thermal conductivity of the first metal plate 15 is good, spreads and is conducted also in the plane direction of the first metal plate 15. The temperature of the first metal plate 15 also rises. Consequently, it expands thermally more than before the temperature arose.

Heat conducted into the first metal plate 15 is conducted to the intermediate layer 13 and the intermediate layer 13 also rises in temperature. Heat having been conducted to the intermediate layer 13 is conducted to the second metal plate 17 and the second metal plate 17 rises in temperature and thermally expands.

Heat conducted to the second metal plate 17 is conducted to the insulating member 18 and the third metal plate 19 and is conducted to the heat sink 12 and is dissipated by the heat sink 12, whereby the heat of the semiconductor element 11 is diffused and the degree of temperature increase can be made small.

At this time, the temperatures of the semiconductor element 11, the first metal plate 15, the intermediate layer 13, the second metal plate 17, the insulating member 18, the third metal plate 19 and the heat sink 12 are higher than before the semiconductor element 11 produced heat. Consequently the different layers tend to thermally expand with the thermal expansion coefficients of the respective materials. At that time, thermal stress arises. By the intermediate layer 13, which is made from a carbon-copper composite material having a small elastic coefficient in the plane direction, that thermal stress is moderated, and the thermal stress arising in the semiconductor device 10 is reduced and warping can be reduced.

From cause and effect isolated and clarified by design of experiment, it was found that by providing a carbon-copper composite material of a suitable thickness as an intermediate layer it was possible to reduce warping with a laminar plate by adjusting the thickness of the first metal plate, the thickness of the second metal plate and the thickness of the third metal plate. It was found that when there is no difference between the thickness of the second metal plate and the thickness of the third metal plate, there is resistance to thermal shock. Thus, by providing an intermediate layer for moderating thermal stress between the semiconductor element and the heat sink, it is possible to reduce warping of the semiconductor device by heat.

INDUSTRIAL APPLICABILITY

As described above, in the present invention, because thermal stress resulting from a difference between thermal expansion of a semiconductor element and thermal expansion of a heat sink arising when the semiconductor element produces heat is moderated with an intermediate layer, warping of the semiconductor device as a whole is reduced. Consequently, besides the full potential performance of the semiconductor element being obtained, it is not necessary for the semiconductor element to be forcibly cooled by means of a large fan or the like, and the invention is useful in all fields in which semi-conductor devices are used.

The invention claimed is:

1. A semiconductor device comprising:
a semiconductor element having a first coefficient of thermal expansion;
a first metal plate bonded to one side of the semiconductor element;
an intermediate layer bonded to one side of the first metal plate remote from the semiconductor element, the intermediate layer being made of a carbon-copper composite material;
a second metal plate bonded to one side of the intermediate layer remote from the first metal plate;
an insulating member bonded to one side of the second metal plate remote from the intermediate layer; and
a third metal plate bonded to one side of the insulating member remote from the second metal plate, the third metal plate having a thickness substantially equal to that of the second metal plate; and,
a heat sink having a second coefficient of thermal expansion, said second coefficient of thermal expansion being different than said first coefficient of thermal expansion;
wherein the intermediate layer absorbs and moderates thermal stress resulting from said first coefficient of thermal expansion being different than said second coefficient of thermal expansion, and
wherein the first, second and third metal plates are made of a same material.

2. A semiconductor device comprising:
a semiconductor element having a first coefficient of thermal expansion;
a heat sink having a second coefficient of thermal expansion, said second coefficient of thermal expansion being different than said first coefficient of thermal expansion; and
a laminar plate provided between the semiconductor element and the heat sink, said laminar plate including an intermediate layer for absorbing and moderating thermal stress resulting from said first coefficient of thermal expansion being different than said second coefficient of thermal expansion,
wherein the laminar plate comprises a first metal plate, the intermediate layer, a second metal plate, an insulating member, and a third metal plate, wherein:
said first metal plate being interposed between the semiconductor element and the intermediate layer, said first metal plate having one side bonded to the semiconductor element and an opposite side bonded to a first side of the intermediate layer;
said second metal plate being interposed between the intermediate layer and the insulating member, whereby one side of said second metal plate is bonded to a second, opposite side of the intermediate layer and the other side of said second metal plate is bonded to a first side of the intermediate layer; and
said insulating member is interposed between the second and third metal plates, whereby said third metal plate is bonded to a second, opposite side of the insulating member.

3. The semiconductor device according to claim 2, wherein a thickness of the second metal plate is equal to a thickness of the third metal plate.

4. The semiconductor device according to claim 2, wherein the intermediate layer for moderating thermal stress comprises a carbon-copper composite material.

5. The semiconductor device according to claim 1, wherein the first metal plate further includes a nickel plating on a surface of the first metal plate to which the semiconductor element is mounted.

6. A semiconductor device comprising:
A semiconductor device comprising:
a semiconductor element;
a first metal plate bonded to one side of the semiconductor element;

an intermediate layer bonded to one side of the first metal plate remote from the semiconductor element, the intermediate layer being made of a carbon-copper composite material;

a second metal plate bonded to one side of the intermediate layer remote from the first metal plate;

an insulating member bonded to one side of the second metal plate remote from the intermediate layer; and a third metal plate bonded to one side of the insulating member remote from the second metal plate, the third metal plate having a thickness substantially equal to that of the second metal plate; and, a heat sink;

wherein the first, second and third metal plates are made of a same material, and wherein a thickness of the second metal plate and the third metal plate is greater than a thickness of the first metal plate.

7. The semiconductor device according to claim 1, wherein the insulating member is formed of a material that is an electrical insulator and a thermal conductor.

8. The semiconductor device according to claim 7, wherein the insulating member is formed of SiN.

9. The semiconductor device according to claim 2, wherein a thickness of the second metal plate and the third metal plate is greater than a thickness of the first metal plate.

10. The semiconductor device according to claim 2, wherein the insulating member is formed of a material that is an electrical insulator and a thermal conductor.

11. The semiconductor device according to claim 10, wherein the insulating member is formed of SiN.

12. The semiconductor device according to claim 2, wherein the first metal plate further includes a nickel plating on a surface of the first metal plate to which the semiconductor element is mounted.

13. The semiconductor device according to claim 1, wherein the semiconductor element has a first side and a second side, the first metal plate has a first side and a second side, and the intermediate layer has a first side and a second side, wherein, the semiconductor element second side is directly bonded to the first side of the metal plate, and the second side of the metal plate is directly bonded to the first side of the intermediate layer.

14. The semiconductor device according to claim 2, wherein the semiconductor element has a first side and a second side, the first metal plate has a first side and a second side, and the intermediate layer has a first side and a second side, wherein, the semiconductor element second side is directly bonded to the first side of the metal plate, and the second side of the metal plate is directly bonded to the first side of the intermediate layer.

* * * * *